(12) United States Patent
Eustis et al.

(10) Patent No.: US 6,675,273 B2
(45) Date of Patent: Jan. 6, 2004

(54) MEMORY CIRCUITRY WITH AUXILIARY WORD LINE TO OBTAIN PREDICTABLE ARRAY OUTPUT WHEN AN INVALID ADDRESS IS REQUESTED

(75) Inventors: Steven Michael Eustis, Essex Junction, VT (US); Robert Lloyd Barry, Essex Junction, VT (US); Peter Francis Croce, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 09/871,057

(22) Filed: May 31, 2001

(65) Prior Publication Data

US 2002/0194443 A1 Dec. 19, 2002

(51) Int. Cl.[7] .............................................. G06F 13/00
(52) U.S. Cl. ...................................... 711/167; 365/194
(58) Field of Search ............................ 711/167; 365/194

(56) References Cited

U.S. PATENT DOCUMENTS

| | | | |
|---|---|---|---|
| 5,003,513 A | | 3/1991 | Porter et al. |
| 5,361,230 A | | 11/1994 | Ikeda et al. |
| 5,414,663 A | * | 5/1995 | Komarek et al. ............ 365/210 |
| 5,440,514 A | * | 8/1995 | Flannagan et al. .......... 365/194 |
| 5,511,031 A | * | 4/1996 | Grover et al. ............... 365/208 |
| 5,657,269 A | * | 8/1997 | Nanamiya ............... 365/185.17 |
| 5,737,566 A | | 4/1998 | Sparks et al. |
| 5,793,698 A | * | 8/1998 | Komarek et al. ...... 365/230.08 |
| 6,185,135 B1 | * | 2/2001 | Netis et al. .................. 365/194 |

* cited by examiner

Primary Examiner—Reba I. Elmore
(74) Attorney, Agent, or Firm—Richard A. Henkler; Bracewell & Patterson, L.L.P.

(57) ABSTRACT

A memory circuitry is designed to efficiently obtain a predictable array output when an invalid address is requested. The memory circuit comprises an invalid word line path in addition to the standard valid word line path. In order to provide correct output, a dummy word line output of a first decode logic is delayed and the delayed dummy word line output is ANDed with a word line output to update the data out latch. Further, the invalid word line output of a second decode logic is also delayed, and the delayed invalid word line output is ORed with the delayed dummy word line output to reset the control logic. ORing the delayed signals allows the predictable output to be provided at a same clock time, irrespective of whether a valid address or an invalid address is decoded.

22 Claims, 5 Drawing Sheets

INVENTION TIMING

INVENTION TIMING (Continued)

MEMORY CIRCUITRY WITH AUXILIARY WORD LINE TO OBTAIN PREDICTABLE ARRAY OUTPUT WHEN AN INVALID ADDRESS IS REQUESTED

BACKGROUND OF THE INVENTION

1. Technical Field

The present invention relates in general to computer memory components and in particular to reading data from computer memory components. Still more particularly, the present invention relates to a method and memory array circuit design for obtaining predictable array output when an invalid address is requested from a memory component.

2. Description of the Related Art

Computer memory components, e.g., random access memory (RAM) and read only memory (ROM), are designed with arrays that are subdivided into a number of address lines that hold data. Each line is capable of holding a certain amount of data based primarily on the size of the line. The total number of lines is typically a power of two (i.e., $2^N$, where N=1, 2, . . . ). The address of the line is utilized to find and access stored data when the data is desired to be read from memory.

During development of a memory array, the memory chip is made to undergo a series of logic test to ensure that data is being read correctly. During the logic tests of a read-only memory (ROM) array, the array is sent random addresses and is expected to give a predictable output. When a valid address is read, the output is predicted to be the data in that address, and the control logic circuitry of the memory array is reset for the next data access.

If the number of word lines contained in the array is not a power of two, there will be some addresses that are "invalid". An invalid address occurs whenever a memory array has more address space than array space. Attempts to read an address that does not contain valid data often proves to be problematic because the result is not predictable. This problem occurs irrespective of if the arrays are ROMs or RAMs. Thus, during the logic test, whenever the random address generator selects these invalid addresses to send to the memory component, there are no corresponding word lines from which data may be provided; however, the memory array still needs to provide a predictable output for the logic test and also has to have its control logic circuitry reset for the next data access.

Some memory array designs decode the invalid address and directly put predicable data in the data out latches. With these designs/methods, however, if an invalid address is incorrectly decoded as a result of skew or a glitch, etc., the read will be ended before the array can correct the data. This ultimately degrades the setup time as illustrated in the timing diagram of FIG. 1A.

Other designs map the invalid address(es) into valid address spaces. However, address mapping is not always possible, particularly on memory arrays with certain pre-decode addressing schemes that are optimized for performance. FIG. 1C illustrates the example timing diagram for such designs.

A third ROM design handles invalid addresses by ignoring them. No data out latch is updated and no circuitry is reset. The ROM waits for the next valid address to be clocked into the chip as shown in the sample timing diagram of FIG. 1B. This is achieved at the expense of performance. An address latch is used that is normally closed and only opens briefly after a clock signal falls in order to capture a new address. A performance-oriented design requires the latch to be normally open and closes immediately upon falling of the clock signal. An internal reset is required at the end of operation to re-open the address latch.

The present invention recognizes that it would therefore be advantageous and desirable to have a memory system design and method that enables the utilization of any address pre-decoding and still efficiently and correctly handle invalid addresses. A method and memory system design that prevents a partially decoded address from being interpreted as invalid and resetting the array prematurely would be a welcomed improvement. These and other benefits are provided by the present invention.

SUMMARY OF THE INVENTION

Disclosed is a method and memory circuitry design for efficiently obtaining predictable array output when an invalid address is requested. The memory circuit design comprises an invalid word line path in addition to the standard valid word line path. In order to provide correct output, a dummy word line output of a first decode logic is delayed and the delayed dummy word line output is ANDed with a word line output to update the data out latch. Further, the invalid word line output of a second decode logic is also delayed, and the delayed invalid word line output is ORed with the delayed dummy word line output to reset the control logic. ORing the delayed signals allows the predictable output to be provided at a same clock time, irrespective of whether a valid address or an invalid address is decoded.

In the preferred embodiment, maintaining similar clock times for valid and invalid addresses is completed by running the invalid word line path parallel to the dummy word line path. Also, both line paths are run on the perimeter of the memory array to allow for scaling as the array increases or decreases in size.

The method of the invention is different from the prior art because it uses an auxiliary address path to achieve a similar cycle time as a normal array read. Further, when an invalid address is requested, the chip does not "hang" and is made ready for the next read. When an invalid address is requested, the chip produces predictable data on the output latches and is ready for the next read.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF AN ILLUSTRATIVE EMBODIMENT

The present invention provides a method and memory component for obtaining predictable output when an invalid address is requested from a specially designed memory array system having an auxiliary word line and related functionality.

Figure 2:
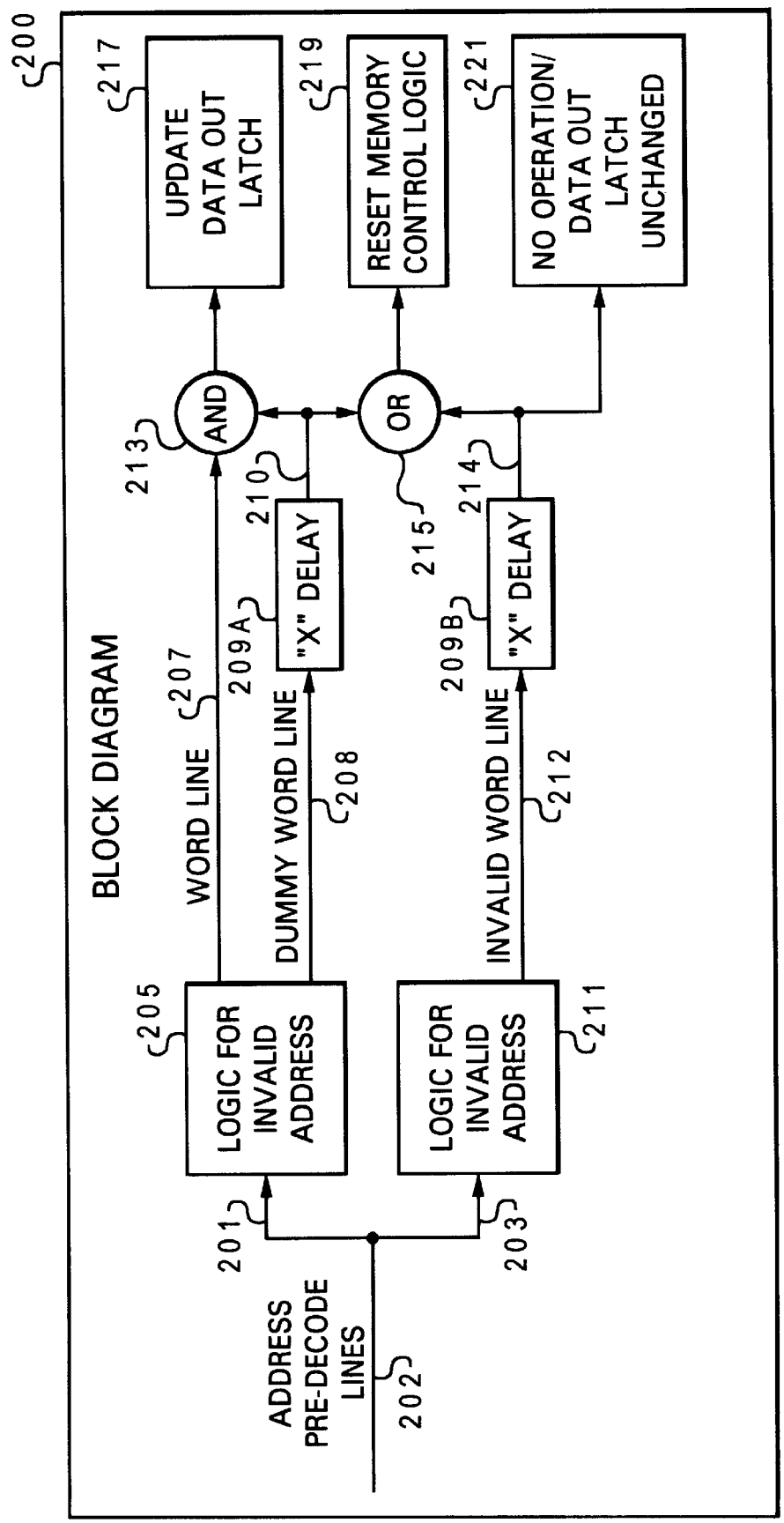
FIG. 2 is a block diagram of a memory array system design with an auxiliary word line in accordance with a preferred embodiment of the present invention.

With reference now to the figures and in particular with reference to FIG. 2, there is illustrated a block diagram representation of address accessing circuitry of memory component 200 according to the preferred embodiment. Address accessing circuitry comprises two line paths for handling received address pre-decode lines 202. The first path 201 includes valid address logic 205 for decoding a valid address. Valid address logic 205 has two output lines, word line 207 and dummy word line 208, each selected based on the output from valid address logic 205. Dummy word line 208 is coupled to first "X" delay logic 209A, which delays the signal from dummy word line 208.

The second path 203 includes invalid address logic 211 for decoding and manipulating invalid addresses. Invalid address logic 211 has a single output line, invalid word line 212, which is coupled to a second "X" delay logic 209B. At the end of the first path 201, the signals/data present on word line 207 and delayed dummy word line 210 are ANDed together via AND logic 213, and the output from the AND logic 213 (i.e., the result of the ANDing operation) is coupled to data out latch 217. The result of the ANDing operation triggers an update of data out latch 217. The delayed dummy word line 210 and delayed invalid word line 214 are ORed via OR logic 215. The output of OR logic 215 is coupled to memory control logic 219. The result of the ORing operation provides a trigger to reset memory control logic 219. The delayed invalid word line signal is also coupled to logic 221 that controls the data out latch 217 and causes the data out latch 217 to remain unchanged.

Accordingly, in operation, when an invalid address is received (or detected), the two-line memory array system decodes the invalid address utilizing invalid address logic 211 and fires and "invalid word line" 212 instead of the "dummy word line" 208. The normal array (i.e., word line 207) does not fire, and the invalid word line 212 leads to circuitry to reset the control logic 219 in preparation for the next data access. Also, the data output latches do not change from the prior address access, and thus, the memory component provides a predictable result.

One advantage of the invention is that it requires few logic or signal additions. The memory design is able to utilize existing performance driven pre-decode address lines. A few logic gates may be added to the dummy word line circuitry to create the detection and drive of the invalid word line. Thus, no new circuitry is needed.

Figure 4A:
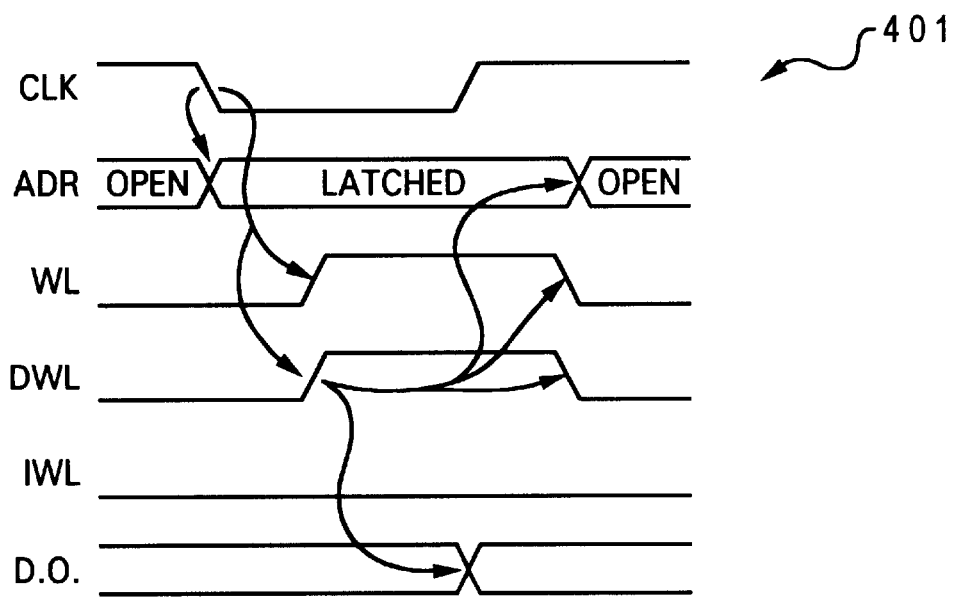
FIGS. 4A–4C are cascading timing diagrams illustrating the operation of the memory array system designed in accordance with the present invention.
Figure 4B:
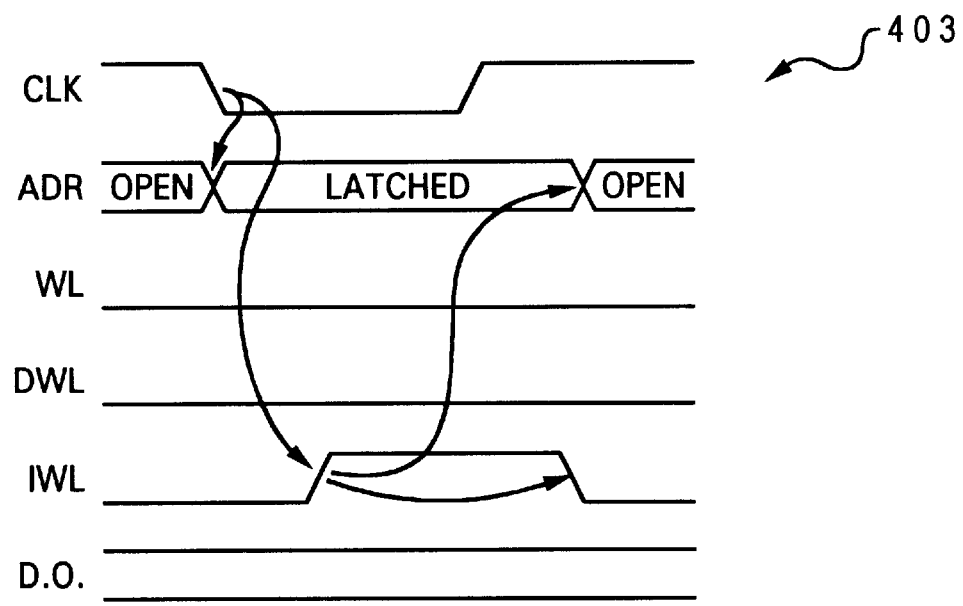
Figure 4C:
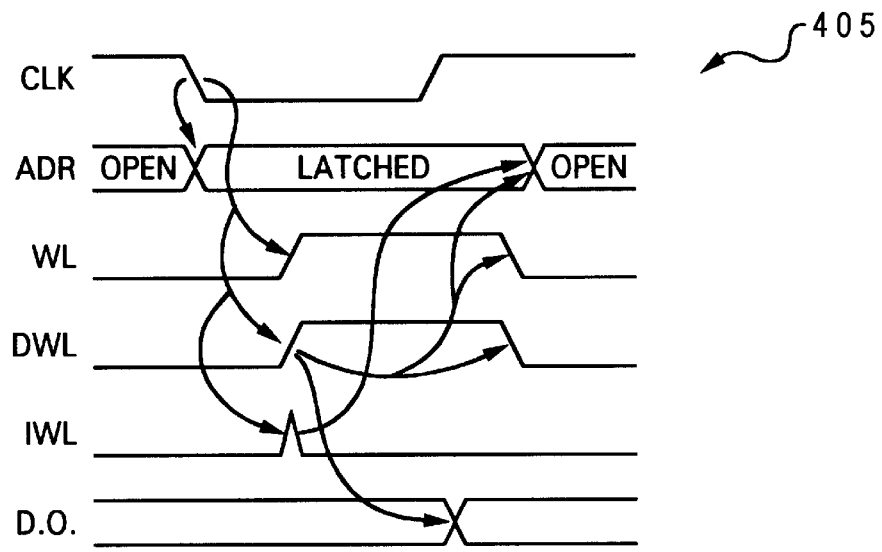

Another feature of the invention is that similar timing paths are generated for the valid and invalid reads as illustrated in FIGS. 4A–4C. FIGS. 4A–4C provide cascading timing diagrams showing the predictable and correct resolution of an invalid word line in a single access cycle. When contrasted to cascading timing diagrams of the memory designs provided in FIGS. 1A–1C, the performance benefit when invalid word lines are provided is measurable. Thus, timing diagram 401 for valid addresses, timing diagram 403 for invalid addresses, and timing diagram 405 for valid addresses with an invalid glitch are almost identical. This feature of the operation of memory array component 200 allows reduced setup times because an incorrect decode "glitch" of an invalid address will process in parallel with the correct valid decode. The dummy word line and invalid word line will reset the circuitry at the same time allowing for the proper data in the data out latches.

Figure 1A:
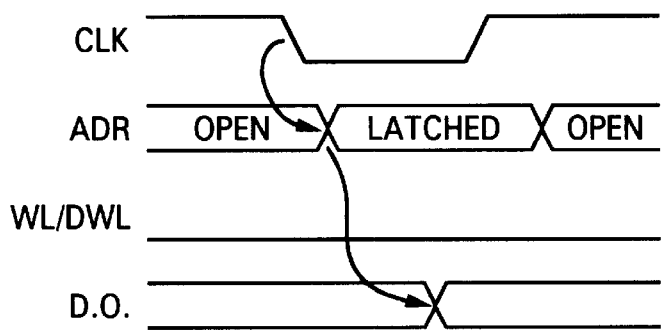
FIGS. 1A–1C are cascading timing diagrams of the operation of existing memory array system.
Figure 1B:
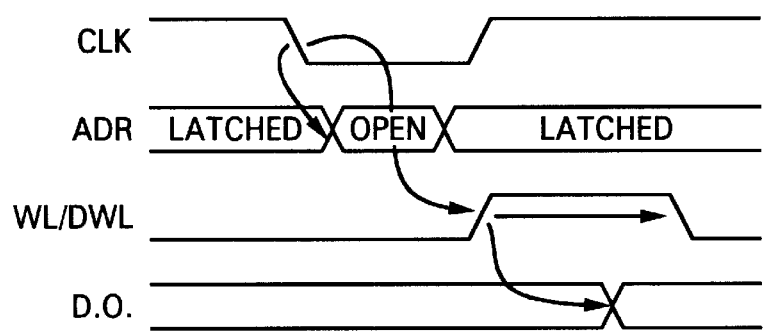
Figure 1C:
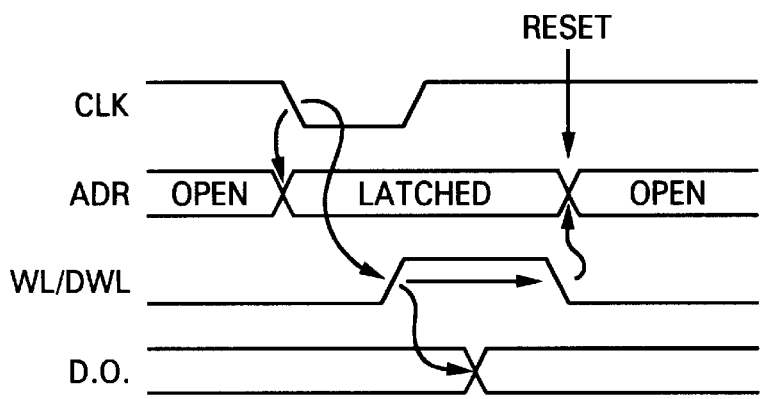

In the operation of some existing prior art, such as presented in FIG. 1A, in which an invalid address is decoded and the circuitry is simply reset, a decode glitch could shut the memory down before proper data is presented to the data out latches. This problem forces the prior art memory design to wait longer to ensure there will be no improper decodes.

The present invention's similar timing is achieved by running the invalid word line parallel to the dummy word line around the perimeter of the array. As the array grows and shrinks for each chip, the invalid word line will also grow and shrink with the dummy word line.

The invention utilizes existing pre-decode lines for the invalid address decode. Also, no extra placeable kernels are required since the invalid word line logic takes place in the same cell as the dummy word line logic. In the preferred embodiment, the invalid word line runs parallel to and along side the end word line and bit line of the array. The invalid word line grows with the array size to achieve a similar timing as the normal dummy word line timing. A glitch on the invalid word line will, therefore, not end the current cycle before the proper data is stored in the data out latches.

By utilizing an auxiliary "invalid" word line, the timing delay is made similar to that of the normal "dummy" word line path. The timing and/or path of the invalid word line will grow and shrink with the other word lines as various size memories are grown. Because of the timing similarity, if an invalid address is decoded as the address lines are changing, the invalid address does not have a chance to "cut off" a valid address memory access once the address lines stabilize.

Figure 3:
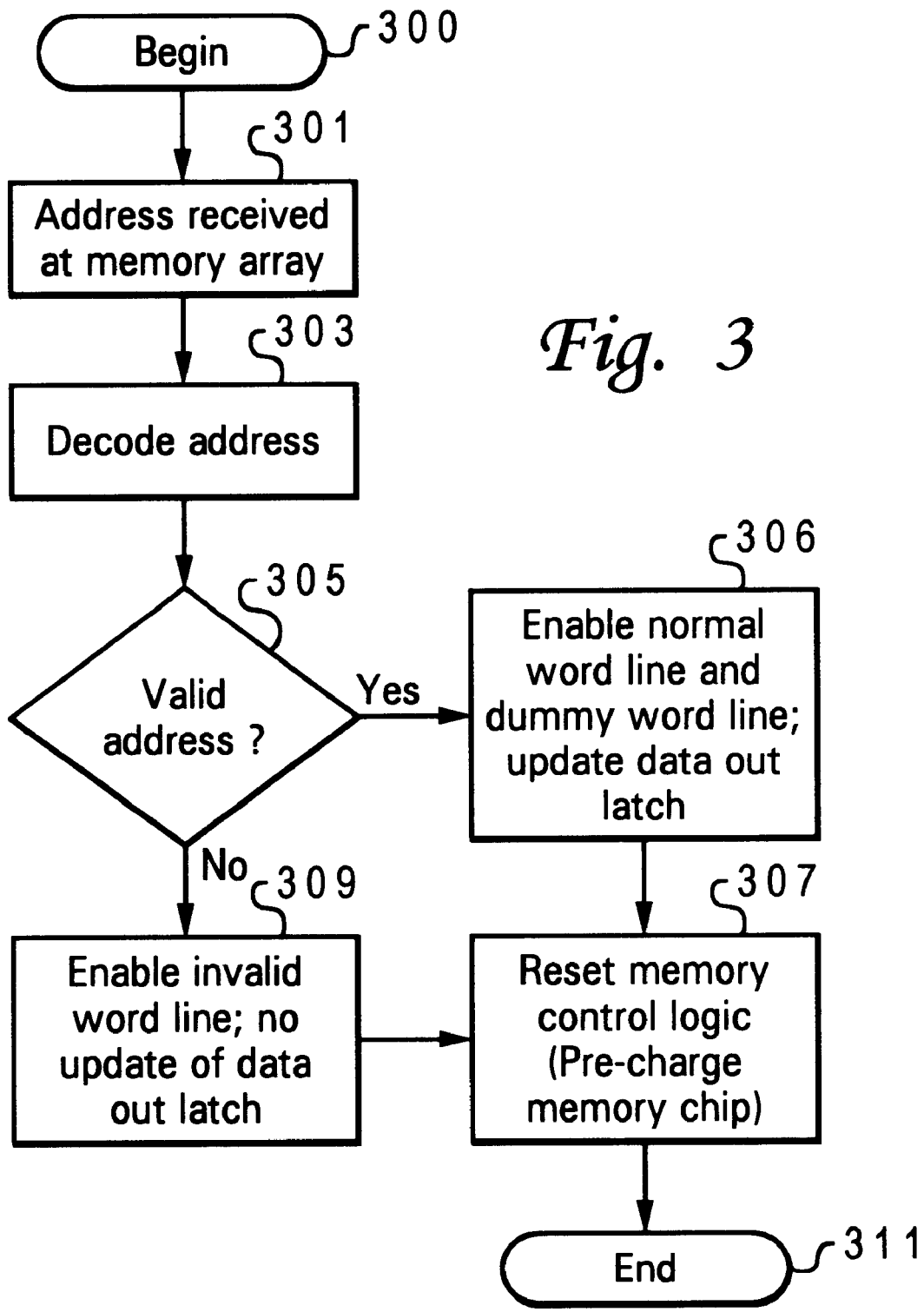
FIG. 3 is a flow chart of the process by which predictable array output is obtained when an invalid address is requested from a memory array system designed in accordance with FIG. 2.

FIG. 3 illustrates a sample operation of memory component 200 of FIG. 2. The process begins at block 300 and proceeds when an address is received as shown at block 301. Once received, the address is decoded as illustrated at block 303. After (or while) the address is decoded, the memory decode logic decides at block 305 whether the address is valid or invalid. If the address is valid, then the normal word line and dummy word line path are enabled at block 306. The data out latch is updated and the memory chip precharges, and the memory control logic is reset at the end of the cycle as depicted at block 307. The operation then ends at block 311.

The invention provides several advantages, including: (1) the provided method may be used with any address pre-decode scheme; (2) timing is similar to that of the normal read path because the invalid word line path grows and shrinks with the various array sizes; and (3) all logic dealing with the invalid address occurs within the current cycle, so a high performance chip has no "front end of cycle" baggage that will limit performance; and (4) if completing a compilable memory on ASIC chips, the method does not create extra placeable kernels.

Memory Circuitry Testing with Predictable Output

As previously described, if the number of word lines contained in the array is not a power of two, there will be some addresses that are "invalid". An invalid address occurs whenever a memory array has more address space than array space. Attempts to read an address that does not contain valid data often proves to be problematic because the result is not predictable.

Memory designs handle invalid addresses several ways: some map invalid addresses to valid addresses; some update the data out latches to a particular state; and others simply leave the data out latches unchanged. It is challenging to test a circuit when no changes occur. The invention provides a method on how to comprehensively test each invalid address for a design that does not update its data out latch when an invalid address is read.

Figure 5:
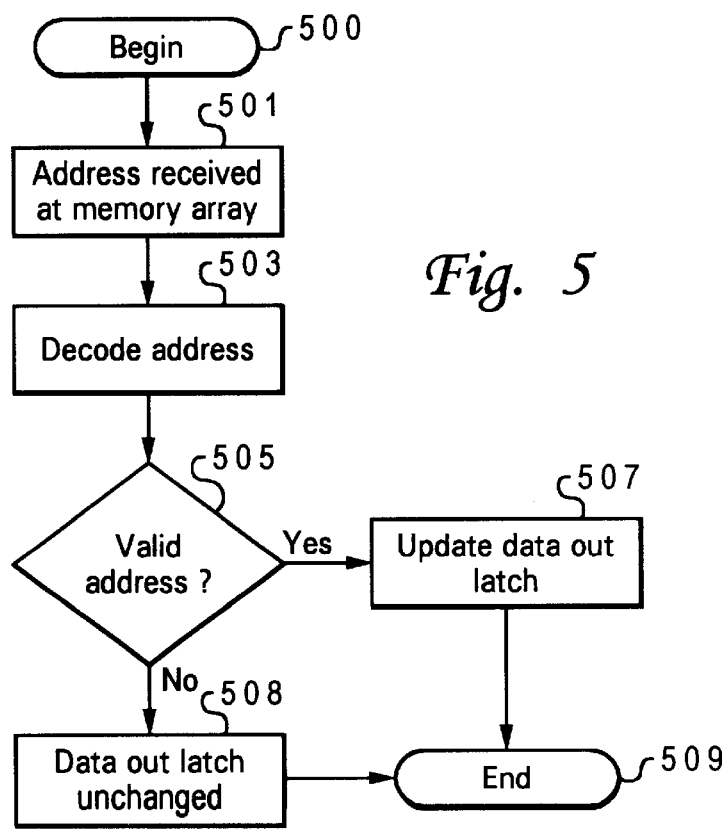
FIG. 5 is a flow chart of the process by which predictable array output is obtained when utilizing the testing method provided according to one preferred embodiment of the present invention.

Notable differences between the design of the present invention and some previous designs include the initialization vector and SISR output. One embodiment of the invention provides a unique testing method by which the memory circuitry may be correctly tested. The invention recognizes that the new circuitry described above needs to be tested exhaustively for stuck-at faults, etc. Furthermore, the invention recognizes that although invalid addresses are logically adjacent, they should not be tested consecutively. FIG. 5 is a flow chart illustrating the process by which the response of the memory array circuitry to invalid addresses is tested. Several function blocks of FIG. 5 are similar to those described above in FIG. 3; however, the process illustrated in FIG. 5 has global application to the testing of any memory component that traditionally does not update its data out latch when an invalid address is read.

The preferred testing procedure requires alternating of valid and invalid addresses. In built-in self-test (BIST) mode, the memory system may be set to the address corresponding to the maximum power of two within the array and decrement from there. For each address, two accesses are completed, one to the complement of the desired address, followed by one to the target address. If a target address is invalid, the complement of the target address will always be a valid address. Thus, each invalid address is tested one at a time with a different valid address read in between.

An example of a non power of two ROM code is illustrated below. The example utilizes 3 address bits, which have 6 valid addresses and 2 invalid addresses.

| C | 000 |   | 000 |   |
|---|-----|---|-----|---|
| T | 111 | 7 | 000 | 0 |
| C | 001 |   | 001 |   |
| T | 110 | 6 | 001 | 1 |
| C | 010 |   |     |   |
| T | 101 | 5 | 101 | 5 |
| C | 011 |   |     |   |
| T | 100 | 4 | 100 | 4 |
| C | 100 |   |     |   |
| T | 011 | 3 | 011 | 3 |
| C | 101 |   |     |   |
| T | 010 | 2 | 010 | 2 |
| C | 110 |   |     |   |
| T | 001 | 1 | 001 | 1 |
| C | 111 |   |     |   |
| T | 000 | 0 | 000 | 0 |

The first column shows the complement/target address scheme. The target address starts at the highest address and counts down, while the complement address begins at the lowest address and counts up. The second column shows which address data is loaded into the SISR. In the preferred embodiment, even though an invalid address is tested, the SISR always obtains data from a valid address and the address accessed is different each cycle. The data is also provided in an easy pattern in ascending order for the invalid addresses and descending order for the valid addresses.

Returning now to FIG. 5, the process begins at block 500 and proceeds when an address is received as shown at block 501. Once received, the address is decoded as illustrated at block 503. After (or while) the address is decoded, the memory decode logic decides at block 505 whether the address is valid or invalid. If the address is valid, then the data out latches are updated properly as shown at block 507. Then the read process ends as illustrated at block 509. If, however, the address is an invalid address, the data out latches remain unchanged as shown at block 508, and then the read process ends at block 509.

Thus, each read to the memory array consists of two reads. The first read is to the complement of the desired address, and the second read is performed on the target address. The result of the second read is read into a SISR. The invention recognizes that the complement of each invalid address is always a valid address. In a memory array that does not update the data out latches during a read to an invalid address, the second and final read will have data from the first read (i.e., from the complement address). In a memory array with "N" invalid addresses, if the maximum power of two addresses are decremented from the point of the first read, the stream of data going into the SISR will appear as if the first "N" valid addresses were read in ascending order from the lowest address (0) followed by all of the valid addresses in descending order from the highest valid address. Thus, the testing process allows any multiple number of reads to be completed so long as the final two reads are to a complement (C) and then a target (T) address. For example, a four read process may be CCCT, CTCT, TCCT, or TTCT, in which the last two reads loaded into the SISR is always CT.

Advantages recognized from the invention include (1) each invalid address is tested one at a time, interspersed by valid addresses such that the output of the array is not a "sea of unchanged data", and (2) no silicon updates are needed to the existing ROM BIST structure (i.e., only the scan initialization vector and SISR signature change).

It is important to note that while the present invention has been described in the context of a fully functional data processing system, those skilled in the art will appreciate that the mechanism of the present invention is capable of being distributed in the form of a computer readable medium of instructions in a variety of forms, and that the present invention applies equally, regardless of the particular type of signal bearing media utilized to actually carry out the distribution. Examples of computer readable media include: nonvolatile, hard-coded type media such as Read Only Memories (ROMs) or Erasable, Electrically Programmable Read Only Memories (EEPROMs), recordable type media such as floppy disks, hard disk drives and CD-ROMs, and transmission type media such as digital and analog communication links.

While the invention has been particularly shown and described with reference to a preferred embodiment, it will be understood by those skilled in the art that various changes in form and detail may be made therein without departing from the spirit and scope of the invention. For example, although the above example provides application of the invention on a compilable Read Only Memory, it is understood that the features and design of the invention applies to all non power of two ROMs and to all non power of two memory arrays which have all cells initialized to a known state.

What is claimed is:

1. A memory array circuit comprising:
    a first word line path for processing valid addresses and which produces a predictable data output at a data out latch and concurrently resets memory control logic; and a second word line path for processing invalid addresses, said second word line path including means for enabling data within the data out latch to remain unchanged when an invalid address is received so that a predictable output is seen in response to said invalid address and wherein said second word line path triggers a reset of said memory control logic when said invalid address is received, wherein further a propagation time on said second word line path for completing said processing of said invalid address is substantially equivalent to a next propagation time on said first word line path for completing a processing of said valid addresses.

2. The memory array circuit of claim 1, wherein:
said first word line path comprises first logic for decoding valid addresses, said first logic having a word line output and dummy word line output, wherein said dummy word line is asserted in response to a receipt of said valid address and a signal of said dummy word line is passed through a first delay circuitry.

3. The memory array circuit of claim 2, wherein:
said second word line path comprises second logic for decoding invalid addresses, said second logic having an invalid word line output that is asserted in response to a receipt of said invalid address and wherein said invalid word line output is passed through a second delay circuitry.

4. The memory array circuit of claim 2, wherein said delayed dummy word line output is ANDed with said word line output to update the data out latch whenever a valid address is received at said first logic.

5. The memory array circuit for claim 3, wherein: responsive to a receipt of an invalid address, only said invalid word line is asserted and the dummy word line output is delayed and ORed with an equally delayed invalid word line output wherein a resulting signal is provided as an input to the memory control logic and resets the memory control logic.

6. The memory array circuit of claim 5, wherein no changes occurs to said data out latch when the invalid word line output is sent to said data out latch.

7. The memory array circuit of claim 6, wherein said dummy word line and said invalid word line are run parallel to each other to achieve similar propagation timing.

8. The memory array circuit of claim 7, wherein said dummy word line and said invalid word line are run along a perimeter of said memory array circuit.

9. A memory array circuit comprising:
a first logic for decoding valid addresses, said logic producing a word line output and a dummy word line output; a second logic for decoding invalid addresses, said second logic producing a single invalid word line output;
a data out latch for holding retrieved data;
a memory control logic that prepares said array for receipt of a next address request when said memory control logic is reset; and
means for producing a predictable output at similar latency for both valid and invalid addresses utilizing combinations of said word line output, said dummy word line output and said invalid word line output and a plurality of delay circuitry, wherein when a valid address is received, said data out latch is updated with valid data and said memory control logic is reset and when an invalid address is received said data out latch is not undated and said memory control logic is reset.

10. The memory array circuit of claim 9, wherein said producing means includes:
a first delay circuitry coupled to said dummy word line output; and
a second delay circuitry coupled to said invalid word line output.

11. The memory array circuit of claim 10, said producing means further comprising:
AND logic coupling said word line output and said delayed dummy word line output, wherein said AND logic is coupled to a data out latch and provides a result for updating said data out latch.

12. The memory array circuit of claim 11, said producing means further comprising:
OR logic coupling said delayed dummy word line and said delayed invalid word line, wherein said OR logic is coupled to a memory control logic and provides a result for resetting said memory control logic.

13. The memory array circuit of claim 12, wherein said dummy word line and said invalid word line are run parallel to each other to achieve similar timing.

14. The memory array circuit of claim 13, wherein said dummy word line and said invalid word line are run along a perimeter of said memory array circuit.

15. A data processing system comprising;
a processor; and
a memory array couple to said processor via an interconnect, said memory array comprising:
a first word line path for processing valid addresses;
a second word line path for processing invalid addresses;
a data out latch for holding retrieved data;
a memory control logic that prepares said array for receipt of a next address request when said memory control logic is reset; and
means for producing a predictable output at similar processing time for both valid and invalid addresses utilizing combinations of said word line output, said dummy word line output and said invalid word line output and a plurality of delay circuitry, wherein when a valid address is received, said data out latch is updated with valid data and said memory control logic is reset and when an invalid address is received said data out latch is not updated and said memo control logic is reset.

16. The data processing of claim 15, wherein:
said first word line path comprises logic for decoding valid addresses, said logic having a word line and dummy word line output, wherein said dummy word line output is passed through a first delay circuitry.

17. The data processing system of claim 16, wherein:
said second word line path comprises logic for decoding invalid address, said logic having an invalid word line output that is passed through a second delay circuitry.

18. The data processing system of claim 17, wherein said delayed dummy word line output is ANDed with said word line output to update a data out latch.

19. The data processing system of claim 18, wherein said delayed dummy word line output is ORed with said delayed invalid word line output to reset memory control logic.

20. The data processing system of claim 19, wherein said delayed invalid word line output produces no change to said data out latch.

21. The data processing system of claim 20, wherein said dummy word line and said invalid word line are run parallel to each other to achieve similar timing.

22. The data processing system of claim 21, wherein said dummy word line and said invalid word line are run along a perimeter of said memory array.

* * * * *